US012615325B2

(12) United States Patent
Yang et al.

(10) Patent No.: US 12,615,325 B2
(45) Date of Patent: Apr. 28, 2026

(54) ELECTRONIC DEVICE INCLUDING SUBSTRATE FIXING MEMBER

(71) Applicant: SAMSUNG ELECTRONICS CO., LTD., Suwon-si (KR)

(72) Inventors: Yonghee Yang, Suwon-si (KR); Changhee Park, Suwon-si (KR); Doil Ku, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 337 days.

(21) Appl. No.: 18/518,163

(22) Filed: Nov. 22, 2023

(65) Prior Publication Data

US 2024/0098170 A1 Mar. 21, 2024

Related U.S. Application Data

(63) Continuation of application No. PCT/KR2022/007360, filed on May 24, 2022.

(30) Foreign Application Priority Data

May 24, 2021 (KR) ........................ 10-2021-0066349

(51) Int. Cl.
*H04M 1/02* (2006.01)
*H05K 5/00* (2006.01)
(52) U.S. Cl.
CPC ........ *H04M 1/0277* (2013.01); *H05K 5/0086* (2013.01)
(58) Field of Classification Search
CPC ................................................. H04M 1/0277
See application file for complete search history.

(56) References Cited

U.S. PATENT DOCUMENTS 5,613,877 A 3/1997 Patel et al.
9,176,524 B2 11/2015 Kitamura et al.
(Continued)

FOREIGN PATENT DOCUMENTS

CN 110797678 A 2/2020
CN 211210044 U 8/2020
(Continued)

OTHER PUBLICATIONS

International Search Report issued Aug. 29, 2022 by the International Searching Authority in International Application No. PCT/KR2022/007360.

*Primary Examiner* — David Bilodeau
(74) *Attorney, Agent, or Firm* — Sughrue Mion, PLLC

(57) ABSTRACT

An electronic device includes: a frame including a coupling surface; a circuit board assembly coupled to the coupling surface of the frame, the circuit board assembly including a circuit board and a fixing hole provided in a surface of the circuit board and penetrating the circuit board in a thickness direction; a connecting member electrically connected to the circuit board assembly; and a circuit board fixing member provided on the coupling surface of the frame and passing through the fixing hole in the circuit board to fix the circuit board assembly to the frame, wherein the circuit board fixing member includes: a snap-fitting portion configured to be elastically deformed when passing through the fixing hole to couple the circuit board assembly to the coupling surface, and configured to prevent the circuit board assembly coupled to the coupling surface from moving; a guide groove in which the connecting member is accommodated; and a body portion fixed on the coupling surface and configured to support the snap-fitting portion and the guide groove.

15 Claims, 11 Drawing Sheets

(56)          References Cited

U.S. PATENT DOCUMENTS

| | | | |
|---|---|---|---|
| 9,288,927 | B2 | 3/2016 | Takechi et al. |
| 10,187,993 | B2 * | 1/2019 | Lee ........................ H05K 1/181 |
| 10,738,813 | B2 | 8/2020 | Jung et al. |
| 11,246,229 | B2 | 2/2022 | Lee et al. |
| 2003/0185644 | A1 | 10/2003 | Ju |
| 2013/0048368 | A1 * | 2/2013 | Malek ................. H04M 1/0274 |
| | | | 174/350 |
| 2013/0089992 | A1 | 4/2013 | Yang |
| 2015/0365508 | A1 * | 12/2015 | Kwon ................... G06F 1/1658 |
| | | | 455/566 |
| 2016/0044816 | A1 * | 2/2016 | Jarvis ..................... H01H 23/04 |
| | | | 361/767 |
| 2017/0245386 | A1 * | 8/2017 | Park .................... H04M 1/0277 |
| 2019/0157752 | A1 | 5/2019 | Yu et al. |
| 2020/0267847 | A1 * | 8/2020 | Lee ........................ H04M 1/026 |
| 2022/0321683 | A1 * | 10/2022 | Luo ..................... H04M 1/0268 |

FOREIGN PATENT DOCUMENTS

| | | | |
|---|---|---|---|
| JP | 7-23014 | Y2 | 5/1995 |
| JP | 2020-178025 | A | 10/2020 |
| KR | 2003-0079176 | A | 10/2003 |
| KR | 10-2013-0038503 | A | 4/2013 |
| KR | 10-2014-0069586 | A | 6/2014 |
| KR | 10-2017498 | B1 | 10/2019 |
| KR | 10-2093413 | B1 | 3/2020 |
| KR | 10-2020-0071702 | A | 6/2020 |
| KR | 10-2020-0101178 | A | 8/2020 |

* cited by examiner

ELECTRONIC DEVICE INCLUDING SUBSTRATE FIXING MEMBER

CROSS-REFERENCE TO RELATED APPLICATIONS

This application is a bypass continuation application of International Application No. PCT/KR2022/007360, filed on May 24, 2022, which is based on and claims the benefit of a Korean Patent Application No. 10-2021-0066349, filed on May 24, 2021, in the Korean Intellectual Property Office, the disclosures of each of which are incorporated by reference herein in their entireties.

BACKGROUND

1. Field

The disclosure relates to an electronic device and, more particularly, to an electronic device including a circuit board fixing member.

2. Description of Related Art

An electronic device includes a circuit board providing wires for electrical connection and a mounting space for electrical components such as integrated circuits, passive elements, sensors, and connection cables. An electronic device may include a plurality of circuit boards for compact arrangement of internal components. The circuit board may be fixed inside the electronic device by fastening members such as screws or rivets. A process of manufacturing an electronic device may include a process such as bolting or riveting to apply fastening members to fix a circuit board inside the electronic device.

A connecting member (e.g., a cable, a coaxial cable, or a ribbon cable) for transmitting a signal or supplying power may be located inside an electronic device. A cable is flexible and is thus movable inside the electronic device. Accordingly, malfunction or failure of the electronic device may occur due to poor contact or short-circuit of the connecting member.

In order to prevent the malfunction or failure of the electronic device due to the movement of the connecting member, the connecting member may be fixed inside the electronic device. Therefore, when assembling the electronic device, a process of fixing the connecting member inside the electronic device by using fixing members such as a C-clip may be included.

SUMMARY

Provided is an electronic device in which the movement of an internal circuit board and a connecting member may be prevented and which may allow an assembly process to be simplified.

According to an aspect of the disclosure, there is provided an electronic device including: a frame including a coupling surface; a circuit board assembly coupled to the coupling surface of the frame, the circuit board assembly including a circuit board and a fixing hole provided in a surface of the circuit board and penetrating the circuit board in a thickness direction; a connecting member electrically connected to the circuit board assembly; and a circuit board fixing member provided on the coupling surface of the frame and passing through the fixing hole in the circuit board to fix the circuit board assembly to the frame, wherein the circuit board fixing member includes: a snap-fitting portion configured to be elastically deformed when passing through the fixing hole to couple the circuit board assembly to the coupling surface, and configured to prevent the circuit board assembly coupled to the coupling surface from moving; a guide groove in which the connecting member is accommodated; and a body portion fixed on the coupling surface and configured to support the snap-fitting portion and the guide groove.

The circuit board fixing member may be integrally molded on the coupling surface of the frame to which the circuit board assembly is coupled.

The body portion of the circuit board fixing member may have a polygonal shape or an elliptical cross-sectional shape.

The body portion of the circuit board fixing member may have a circular cross-sectional shape, and wherein the circuit board fixing member may include at least one movement prevention protrusion protruding from the body portion in a direction parallel to a surface of the circuit board assembly.

The body portion of the circuit board fixing member may have a tapered shape in which a diameter increases in a direction in which the circuit board assembly is coupled to the frame.

The snap-fitting portion may include a first inclined surface which is inclined in a direction in which a width of the snap-fitting portion increases in a direction in which the circuit board assembly is coupled to the frame.

The snap-fitting portion may include a second inclined surface disposed below the first inclined surface, and wherein the second inclined surface may be inclined in a direction in which the width of the snap-fitting portion decreases in a direction in which the circuit board assembly is coupled to the frame.

A support member may include a fixing member accommodating portion fastened to the coupling surface of the frame and configured to press the circuit board assembly, wherein the support member may have a shape corresponding to a shape of an upper end portion of the circuit board fixing member.

The guide groove may include irregularities provided on an inner surface thereof.

According to an aspect of the disclosure, there is provided a circuit board fixing member for an electronic device, which includes a frame, a circuit board assembly coupled to a coupling surface of the frame and a fixing hole, and a cable coupled to a circuit board, the circuit board fixing member including: a snap-fitting portion configured to be elastically deformed when passing through the fixing hole to couple the circuit board assembly to the coupling surface and configured to prevent the circuit board assembly coupled to the coupling surface from moving; a cable guide groove configured to accommodate the cable therein; and a body portion fixed on the coupling surface of the frame and configured to support the snap-fitting portion and the cable guide groove.

The body portion of the circuit board fixing member may have a polygonal shape or elliptical cross-sectional shape.

The body portion of the circuit board fixing member may have a circular cross-sectional shape, and wherein the circuit board fixing member may include at least one movement prevention protrusion protruding from the body portion in a direction parallel to a surface of the circuit board assembly.

The body portion of the circuit board fixing member may have a tapered shape in which a diameter increases in a direction in which the circuit board assembly is coupled to the frame.

The snap-fitting portion may include a first inclined surface which is inclined in a direction in which a width of the snap-fitting portion increases in a direction in which the circuit board assembly is coupled to the frame.

The snap-fitting portion may include a second inclined surface disposed below the first inclined surface, and wherein the second inclined surface may be inclined in a direction in which the width of the snap-fitting portion decreases in a direction in which the circuit board assembly is coupled to the frame.

According to one or more embodiments of the disclosure, a circuit board fixing member may be coupled to a circuit board of an electronic device to prevent the circuit board from moving, and a connecting member may be fixed via a guide groove provided in the circuit board fixing member. In addition, when assembling the circuit board of the electronic device, the circuit board and the connecting member are fastened by the circuit board fixing member without separate fastening members. As a result, the assembly process may be simplified.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
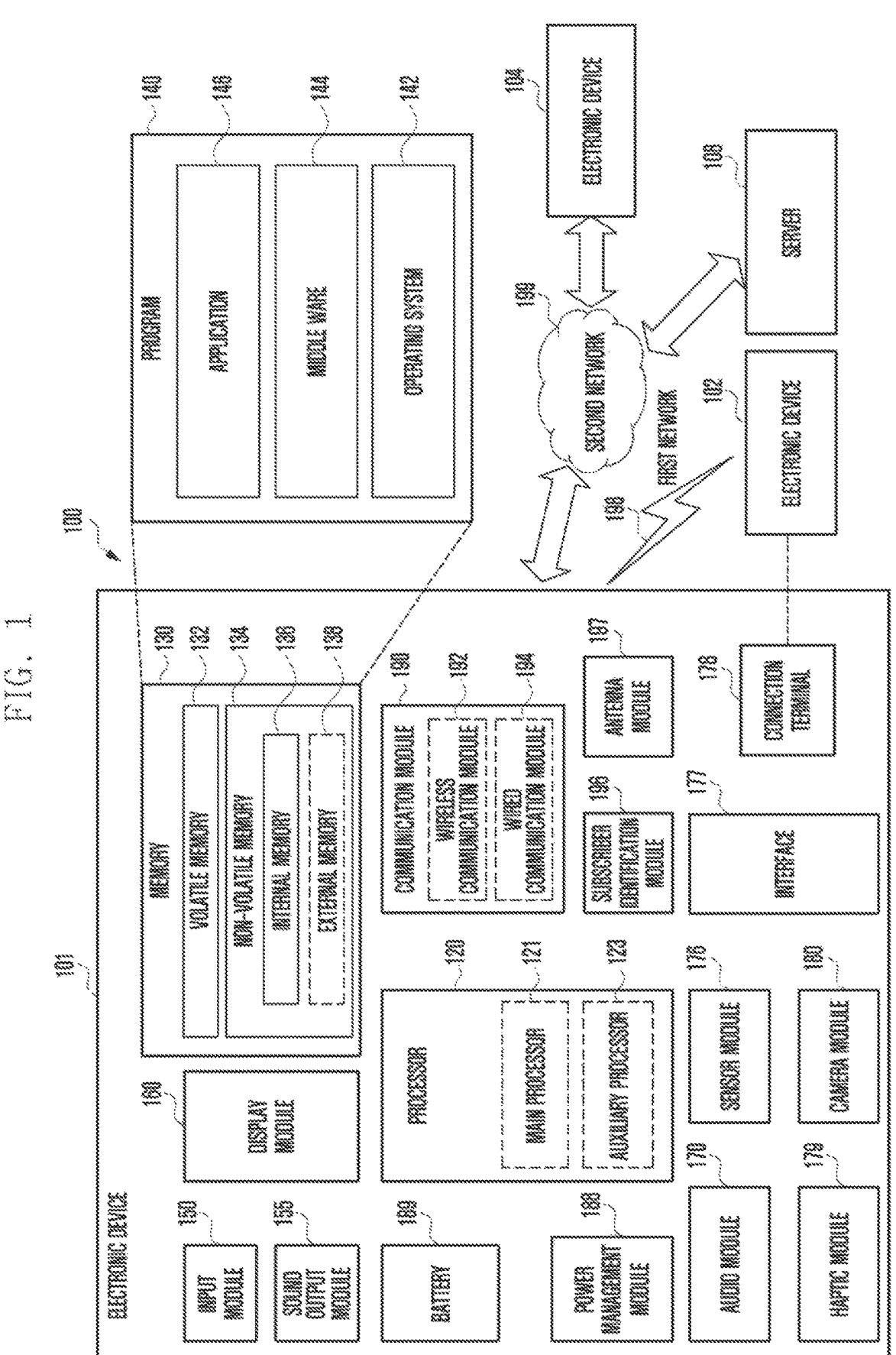
FIG. 1 is a block diagram of an electronic device according to one or more embodiments in a network environment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
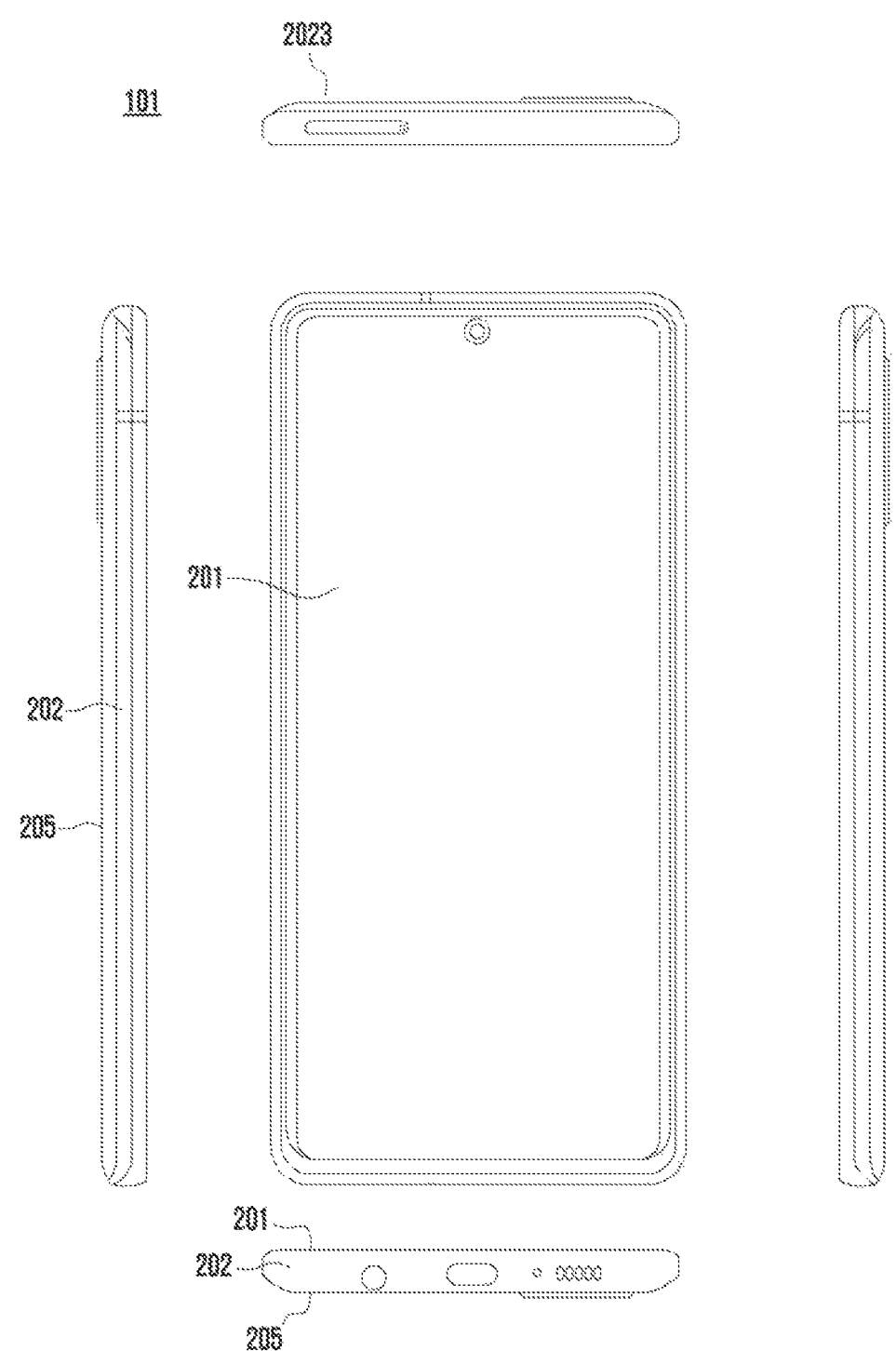
FIG. 2A illustrates a front view, a side view, a plan view, and a rear view of an electronic device according to one or more embodiments of the disclosure.

FIG. 2A illustrates a front view, a side view, a plan view, and a rear view of an electronic device according to one or more embodiments of the disclosure.

Figure 2B:
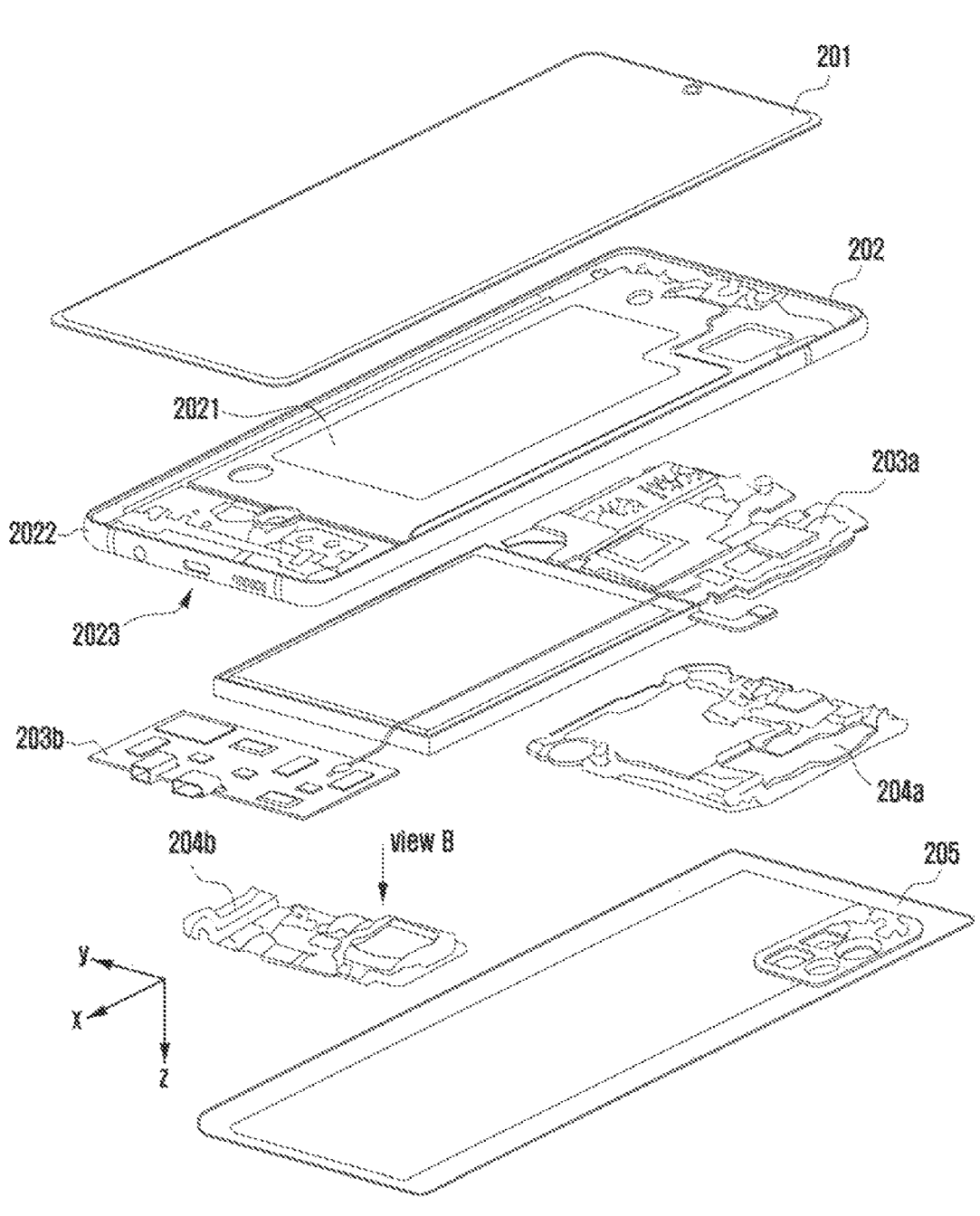
FIG. 2B is an exploded perspective view of the electronic device according to one or more embodiments.

FIG. 2B is an exploded perspective view of the electronic device according to one or more embodiments of the disclosure.

Referring to FIGS. 2A and 2B, an electronic device 101 may include a display 201, a frame 202, circuit board assemblies 203a and 203b, support members 204a and 204b, and a rear surface cover 205.

In the following description, a direction where the circuit board assemblies are coupled to the frame (a direction where the surface of the display 201 faces) may be defined as a downward direction (the −z direction), and a direction opposite to the direction may be defined as an upward direction (the z direction).

According to an embodiment, the display 201 may include a display device 160, such as a TFT-LCD or an organic light-emitting diode display, a control circuit configured to control the display device, and a transparent cover configured to protect the display device. In some embodiments, the display 201 may further include a touch circuit configured to detect a user's touch input and/or a biometric sensor configured to recognize biometric information.

According to an embodiment, the frame 202 may support the display 201 and may include an inner space in which the circuit board assemblies 203a and 203b to be described later and various internal components of the electronic device 101 may be placed. In some embodiments, the frame 202 may include an inner frame 2021 configured to support the internal components of the electronic device 101 and an outer frame 2022 configured to surround the inner frame 2021 in four directions. At least one surface of the inner frame 2021 may include a coupling surface 2023 to which a circuit board 203 to be described later is to be coupled.

The circuit board assemblies (printed circuit board assemblies (PBAs)) 203a and 203b according to an embodiment may include electrical components of the electronic device 101 such as the processor 120, the communication module 190, the memory 130, the sensor module 176, the camera module 180, and the battery 189 of FIG. 1. In addition, the circuit board assemblies may include a circuit board, such as a printed circuit board (PCB), which allows the above-described components to be electrically connected to each other. The electronic device 200 may include a plurality of circuit board assemblies 203a and 203b. A connecting member (e.g., a cable 2031) may be coupled to the circuit board assemblies 203a and 203b.

According to an embodiment, the support members 204a and 204b may be coupled to the frame 202 and may physically support the circuit board assemblies 203a and 203b and the electrical components mounted on the circuit boards to prevent the circuit board assemblies and the electrical components from being separated from the frame 202. The support members may include a first support member 204a and a second support member 204b. The rear surface cover 205 may protect the internal components of the electronic device 101 by covering the rear surface of the electronic device 101.

Figure 3A:
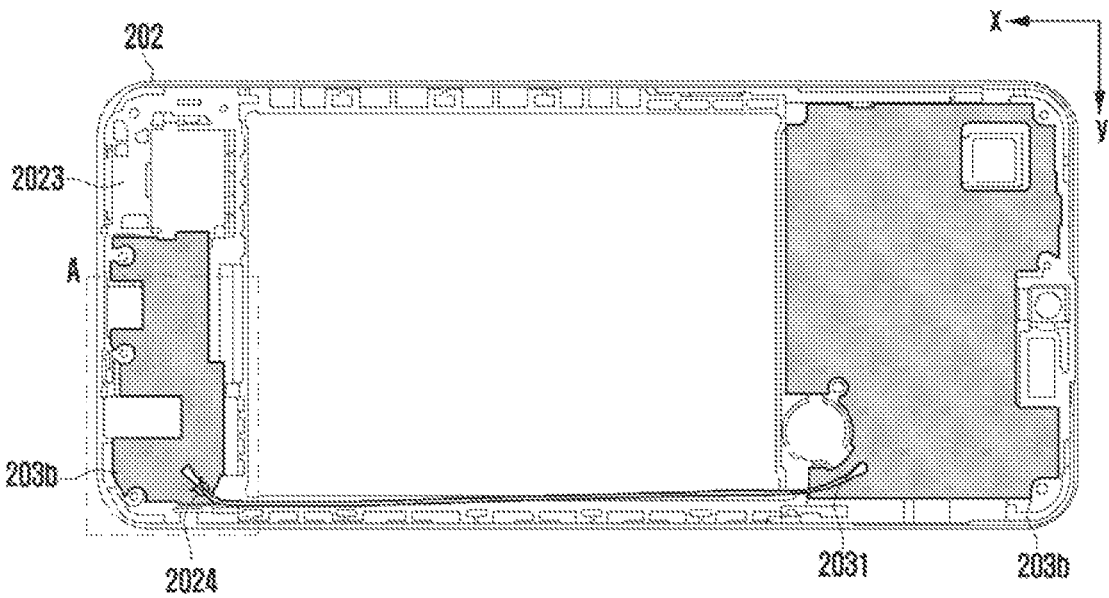
FIG. 3A is a plan view illustrating a frame and a circuit board assembly of an electronic device according to one or more embodiments.

FIG. 3A is a plan view illustrating a frame 202 and circuit board assemblies 203a and 203b of an electronic device 101 according to one or more embodiments.

Figure 3B:
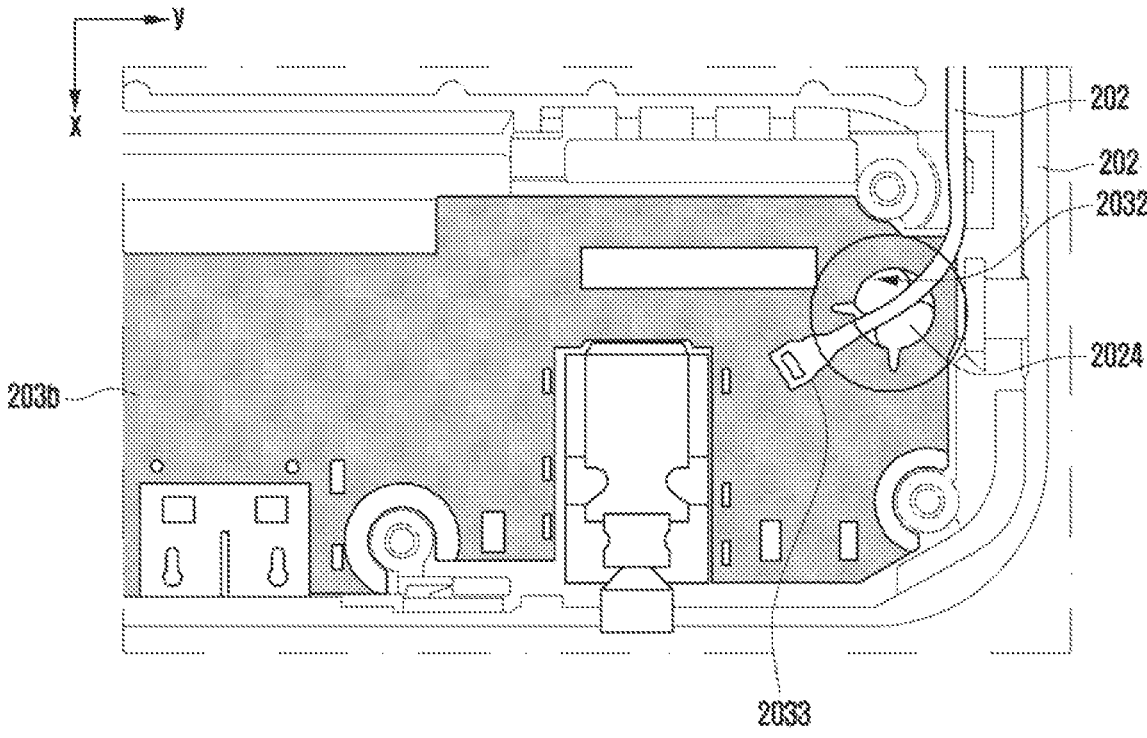
FIG. 3B is an enlarged plan view of a portion of a frame and board assembly of the electronic device.

FIG. 3B is a partial enlarged plan view of the frame 202 and the circuit board assemblies 203a and 203b of the electronic device.

FIG. 3B is an enlarged view of part A of FIG. 3A.

Referring to FIG. 3A, the frame 202 may be a support structure to which components of an electronic device such as circuit board assemblies 203a and 203b may be coupled. The frame 202 may include a coupling surface 2023 where the circuit board assemblies 203a and 203b may be coupled to the frame 202. The coupling surface 2023 may include irregularities corresponding in shape to the circuit board assemblies 203a and 203b that may be coupled to the coupling surface 2023. The frame 202 may include a circuit board fixing member 2024 configured to fix the circuit board assemblies 203a and 203b to the coupling surface 2023. The circuit board fixing member 2024 will be described later.

The circuit board assemblies 203a and 203b according to an embodiment may include a first circuit board assembly 203a and a second circuit board assembly 203b. The first circuit board assembly 203a and the second circuit board assembly 203b may include a circuit board including main components of the electronic device, such as a processor and a memory, or a circuit board including auxiliary components, such as a charging terminal, an output terminal, a speaker, and a DAC. One or more embodiments of the disclosure are described centering on the second circuit board assembly 203b, and regarding the first circuit board assembly 203a, reference may be made to the description of the first circuit board assembly 203a unless contradictory.

The cable 2031 according to an embodiment may be coupled to the circuit board assemblies 203a and 203b inside the electronic device. The cable 2031 may electrically connect the circuit board assemblies 203a and 203b to each other or electrically connect electrical components not mounted on the circuit board assemblies 203a and 203b to the circuit board assemblies 203a and 203b. The cable 2031 may include contacts 2033 configured to be coupled to the circuit board assemblies 203a and 203b to electrically connect terminal ends of the cable to circuit boards. In FIG. 3A, the cable 2031 is illustrated as interconnecting the first and second board assemblies 203a and 203b. However, this is exemplary and does not limit the disclosure. The cable 2031 may include a ribbon cable 2031, a flexible cable 2031, or a coaxial cable 2031. The cable 2031 may be fixed to the circuit board assemblies 203*a* and 203*b* by a circuit board fixing member 2024 to be described later.

Referring to FIG. 3B, the second circuit board assembly 203*b* may include a fixing hole 2032. The fixing hole 2032 may be a through hole provided in the surface of the circuit board to penetrate the circuit board in the thickness direction in order to fix the circuit board to the frame 202. The fixing hole 2032 may have a shape, such as a circular shape, an elliptical shape, or a polygonal shape. The shape of the fixing hole 2032 may be a shape corresponding to the cross-sectional shape of the circuit board fixing member 2024 to be described later.

Figure 4A:
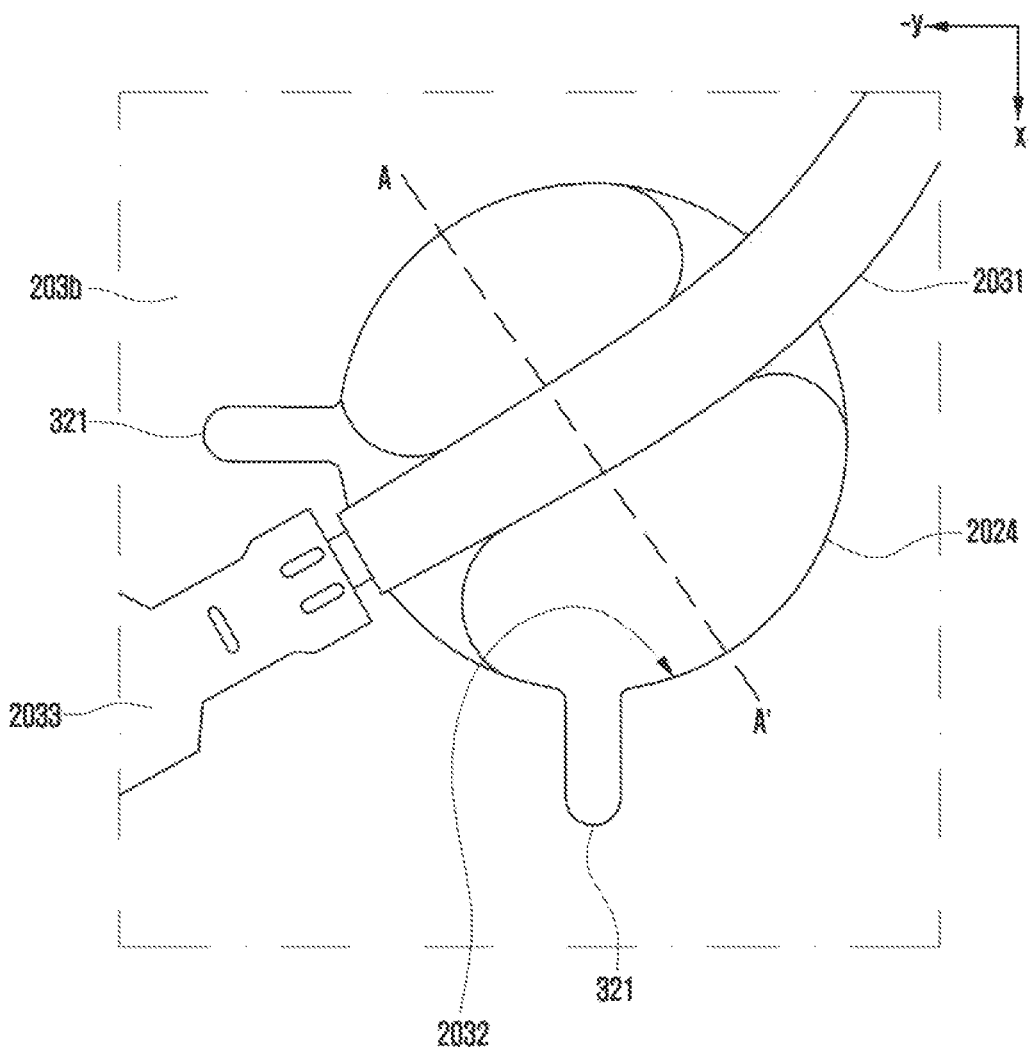
FIG. 4A is a plan view illustrating a circuit board fixing member according to one or more embodiments of the disclosure.

FIG. 4A is a plan view illustrating a circuit board fixing member 2024 according to one or more embodiments of the disclosure.

Figure 4B:
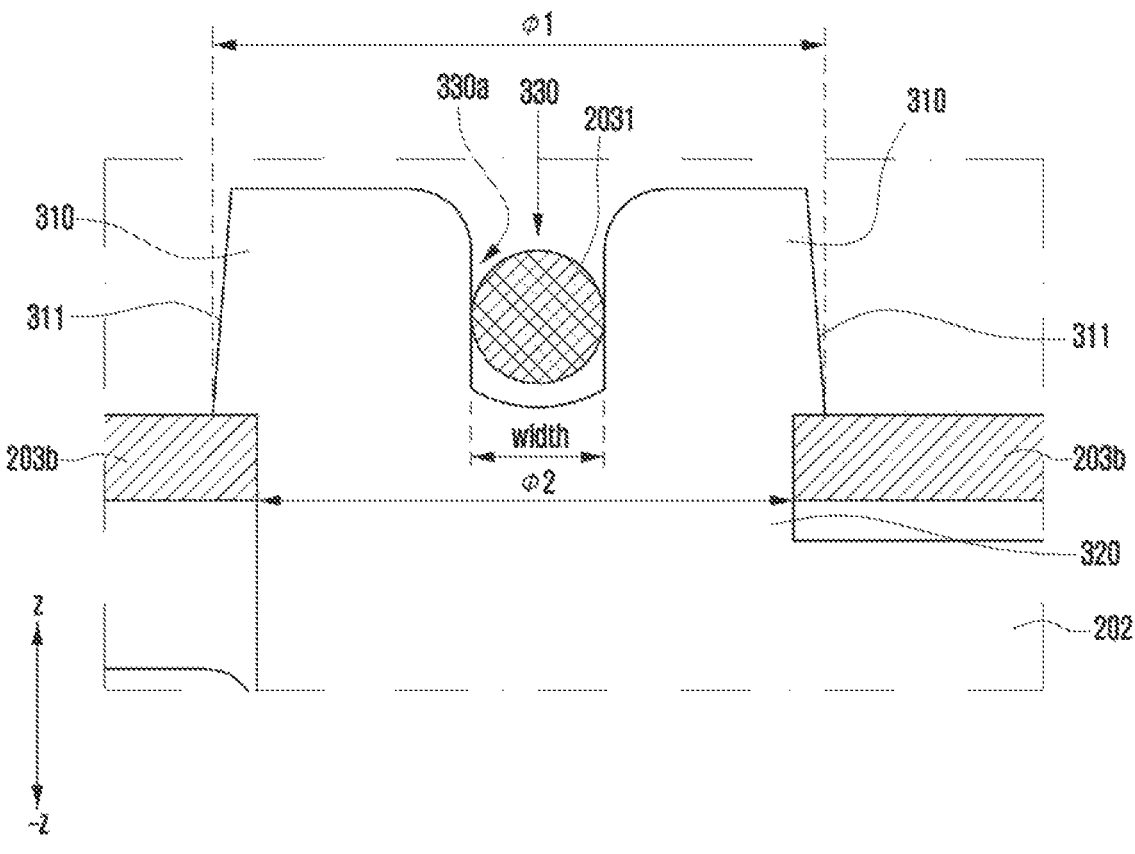
FIG. 4B is a cross-sectional view illustrating a side surface of the circuit board fixing member according to one or more embodiments of the disclosure.

FIG. 4B is a cross-sectional view illustrating a side surface of the circuit board fixing member 2024 according to one or more embodiments of the disclosure.

The cross section in FIG. 4B is a cut surface taken along line A-A' direction in FIG. 4A.

Referring to FIGS. 4A and 4B, the circuit board fixing member 2024 may include a snap-fitting portion 310, a guide groove 330, and a body portion 320.

According to an embodiment, the snap-fitting portion 310 is elastically deformed while passing through the fixing hole 2032 in the second circuit board assembly 203*b* when the second circuit board assembly 203*b* is coupled to the frame 202. The snap-fitting portion 310 may include an elastically deformable material. For example, the snap-fitting portion 310 may be made of an elastic synthetic resin material. The structure of the snap-fitting portion 310 may include a general snap-fitting mechanism, for example, a cantilever snap-fitting mechanism.

The diameter $\Phi1$ of the snap-fitting portion 310 may be larger than the diameter $\Phi2$ of the fixing hole 2032. When the second circuit board assembly 203*b* is coupled to the frame 202, the diameter of the snap-fitting portion 310 can be reduced by elastic deformation to allow the snap-fitting portion 310 to pass through the fixing hole 2032. When the coupling between the second circuit board assembly 203*b* and the frame 202 is completed, the snap-fitting portion 310 may return from elastic deformation to the diameter before the snap-fitting portion passes through the fixing hole 2032. Accordingly, it is possible to prevent the second circuit board assembly 203*b* from being separated from the frame 202 during the assembly process of the electronic device.

In some embodiments, the side surface of the snap-fitting portion 310 may include a first inclined surface 311. When the second circuit board assembly 203*b* is coupled to the frame 202, the inner surface of the fixing hole 2032 presses the first inclined surface 311 in the lateral direction, so that the snap-fitting portion 310 can be elastically deformed.

The body portion 320 according to an embodiment may be a portion that is fixed on a coupling surface of the frame 202 and supports the snap-fitting portion 310 and the fixing groove. In some embodiments, the body portion 320 may be molded integrally with a portion of the frame 202, for example, the inner frame (2021 in FIG. 2B). The cross-sectional shape of the body portion 320 may be circular. In another embodiment, the cross-sectional shape of the torso 320 may be polygonal or elliptical. The fixing hole 2032 provided at the circuit board assemblies 203*a* and 203*b* may have a shape corresponding to the cross-sectional shape of the body portion 320, such as a circular shape, a polygonal shape, or an elliptical shape. The body portion 320 having the polygonal or elliptical cross-sectional shape has an effect of preventing the circuit board assemblies 203*a* and 203*b* from rotating and moving in the state in which the circuit board assemblies 203*a* and 203*b* are coupled to the frame 202.

In some embodiments, the body portion 320 may include a movement prevention protrusion 321. The movement prevention protrusion 321 may be a protrusion extending in a lateral direction of the body 320 (which refers to a direction perpendicular to the upward/downward direction and parallel to the surfaces of the circuit board assemblies, for example, the x or y-axis direction in FIG. 4A). The fixing hole 2032 in the circuit board assemblies 203*a* and 203*b* may have a shape corresponding to the cross sections of the body portion 320 and the movement prevention protrusion 321. When the body portion 320 has a circular shape, the movement prevention protrusion 321 may prevent the circuit board assemblies 203*a* and 203*b* from moving by rotation. In addition, the movement prevention protrusion 321 may also prevent the circuit board assemblies 203*a* and 203*b* from moving by undergoing parallel displacement in a direction perpendicular to the direction in which the movement prevention protrusion 321 extends. In some embodiments, a plurality of movement prevention protrusions 321 may be provided on the body portion 320 in different directions. When the body portion 320 includes at least two movement prevention protrusions 321 provided in different directions, the circuit board assemblies 203*a* and 203*b* may be restricted in parallel movement in all directions parallel to the surface of the circuit board assemblies 203*a* and 203*b*.

The guide groove 330 according to an embodiment may be a groove provided in the circuit board fixing member 2024 to couple the cable 2031 to the guide groove 330. The size and shape of the guide groove 330 may correspond to the size and shape of the cable 2031 fixed to the guide groove 330. In some embodiments, the width of the guide groove 330 may be smaller than the diameter of the cable 2031, and the cable 2031 may be coupled to the guide groove 330 in an interference-fit manner. In another embodiment, fine irregularities may be formed on the inner surface 330*a* of the guide groove 330. The fine irregularities increase the frictional force between the inner surface of the guide groove 330 and the cable 2031, thereby increasing the capability of fixing the cable 2031.

Figure 5A:
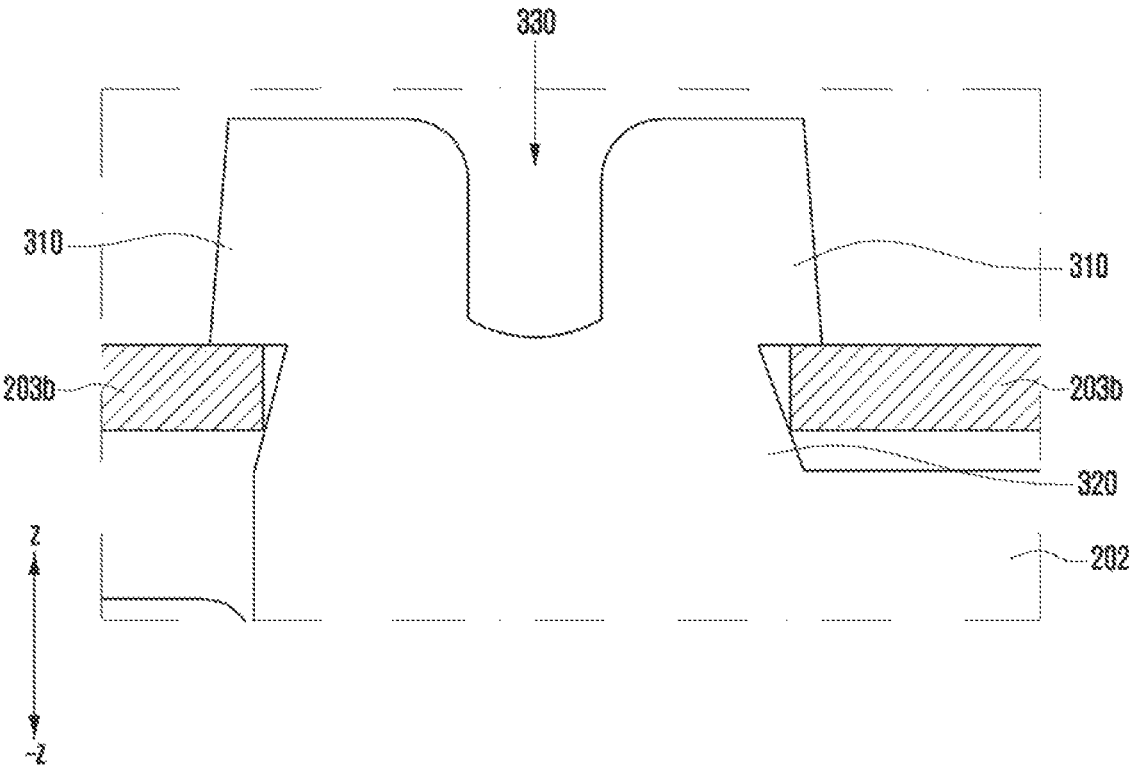
FIG. 5A is a cross-sectional view illustrating a side surface of a circuit board fixing member according to one or more embodiments of the disclosure.

FIG. 5A is a cross-sectional view illustrating a side surface of a circuit board fixing member 2024 according to one or more embodiments of the disclosure.

Figure 5B:
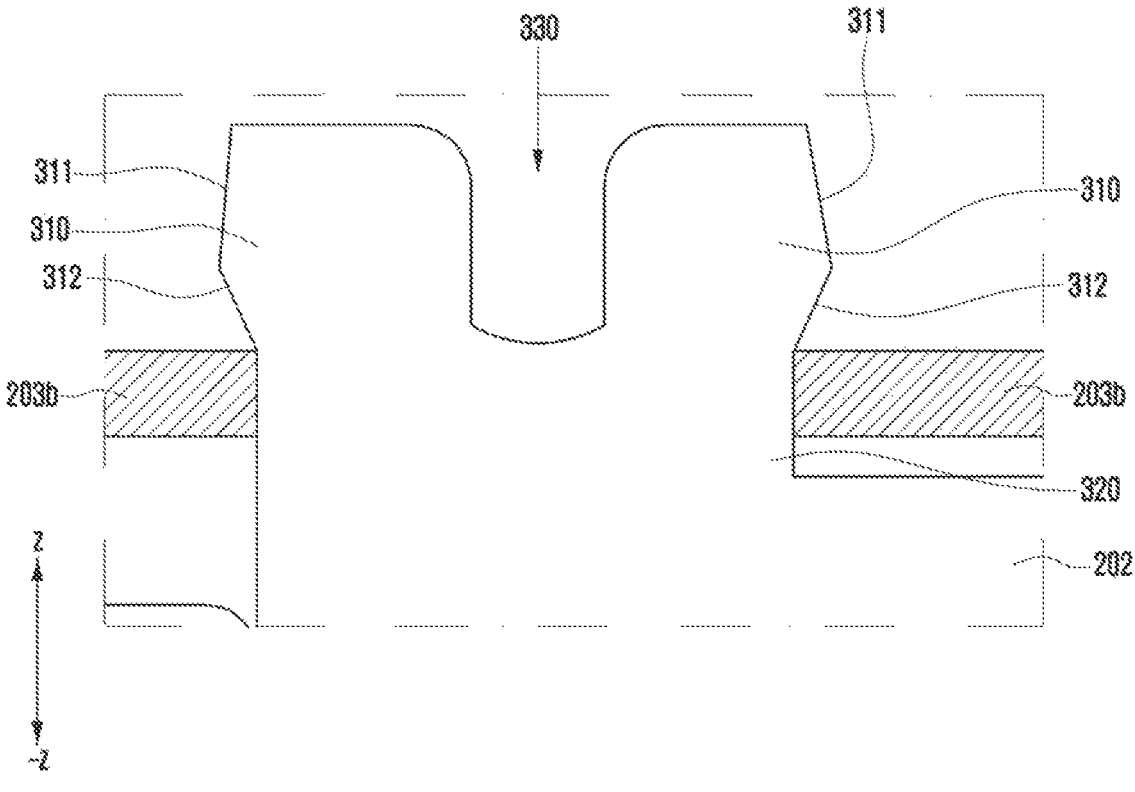
FIG. 5B is a cross-sectional view illustrating a side surface of a circuit board fixing member according to one or more embodiments of the disclosure.

FIG. 5B is a cross-sectional view illustrating a side surface of a circuit board fixing member 2024 according to one or more embodiments of the disclosure.

Figure 5C:
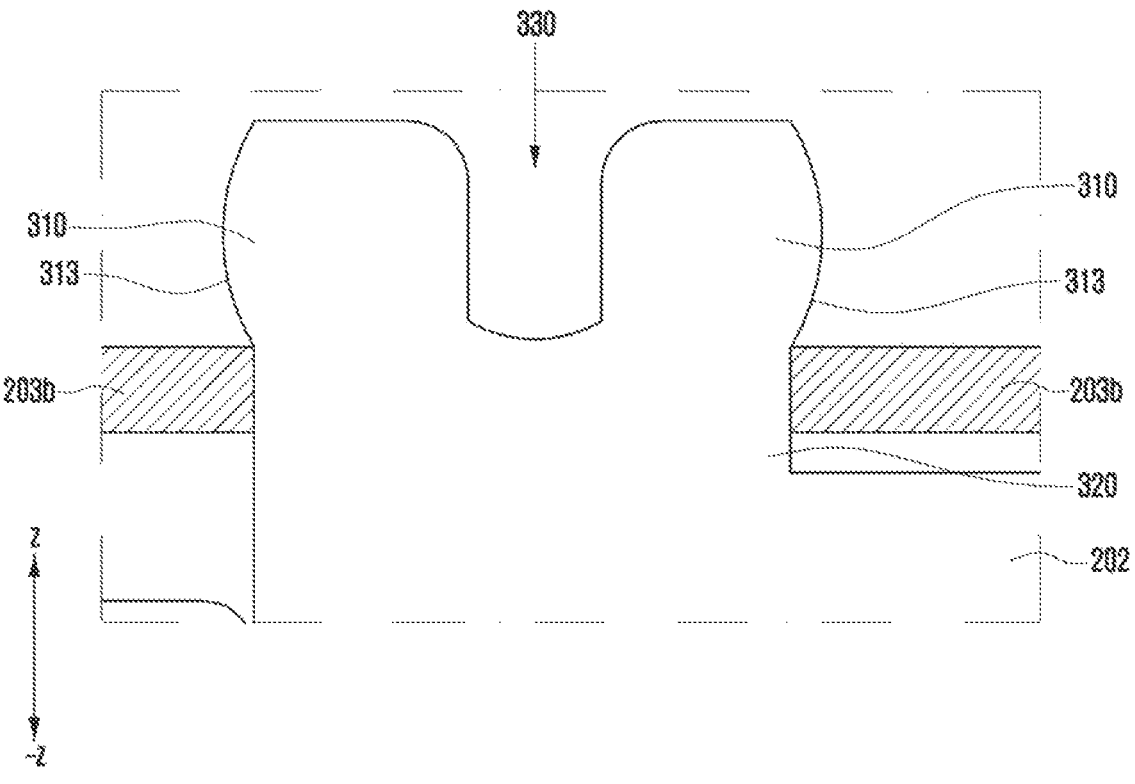
FIG. 5C is a cross-sectional view illustrating a side surface of a circuit board fixing member according to one or more embodiments of the disclosure.

FIG. 5C is a cross-sectional view illustrating a side surface of a circuit board fixing member 2024 according to one or more embodiments of the disclosure.

Referring to FIG. 5A, a body portion 320 of the circuit board fixing member 2024 according to some embodiments of the disclosure may include a tapered shape. The tapered shape may have a larger diameter at a portion where the body portion 320 is coupled and gradually decrease in diameter toward the top (in the z-axis direction). Since the body portion 320 has a tapered shape, when the second circuit board assembly 203*b* is coupled to the frame 202, the tolerance between the fixing hole 2032 formed in the second circuit board assembly 203*b* and the body portion 320 can be reduced and the lateral movement of the circuit board assemblies 203*a* and 203*b* can be prevented.

When manufacturing the electronic device, a tolerance may exist between the fixing hole 2032 and the body portion 320 as a clearance for convenience of assembly and/or a tolerance corresponding to errors in manufacturing. The tolerance between the fixing hole 2032 and the body portion 320 may vary from product to product. Since the body portion 320 includes a tapered shape, when a tolerance exists between the fixing hole 2032 and the body portion 320, the tolerance can be reduced by finely moving the circuit board assemblies 203a and 203b downward (in the −z direction in the drawing). Accordingly, the movement of the second circuit board assembly 203b coupled to the body portion 320 can be prevented.

Referring to FIG. 5B, the snap-fitting portion 310 of the circuit board fixing member 2024 according to some embodiments of the disclosure may include a second inclined surface 312. The second inclined surface 312 may be provided at the lower end portion of the first inclined surface 311. The second inclined surface 312 may have an inclination in a direction opposite to that of the first inclined surface 311, that is, an inclination in which the width of the snap-fitting portion 310 gradually decreases downward. Accordingly, when the fixing hole 2032 is brought into contact with the second inclined surface 312, the second inclined surface 312 presses the second circuit board assembly 203b downward (in the −z direction) due to the elastic force of the snap-fitting portion 310.

Referring to FIG. 5C, the snap-fitting portion 310 of the circuit board fixing member 2024 according to one or more embodiments of the disclosure may include a curved surface shape, such as a spherical surface or an ellipsoidal surface. Since the snap-fitting portion 310 has a curved shape, the upper portion of the curved surface is capable of pressing the snap-fitting portion 310 laterally to elastically deform the snap-fitting portion 310 during assembly like the above-described first inclined surface 311, and the lower portion of the curved surface is capable of elastically pressing the circuit board assemblies 203a and 203b like the above-described second inclined surface 312.

By pressing the circuit board assemblies 203a and 203b downward, that is, toward the frame 202, the snap-fitting portion is capable of preventing the snap the circuit board assemblies 203a and 203b from moving upward and downward. In addition, when the body portion 320 of the circuit board fixing member 2024 has the above-described tapered shape, the circuit board assemblies 203a and 203b are pressed downward so that the tolerance between the body portion 320 and the fixing hole 2032 can be reduced.

Figure 6:
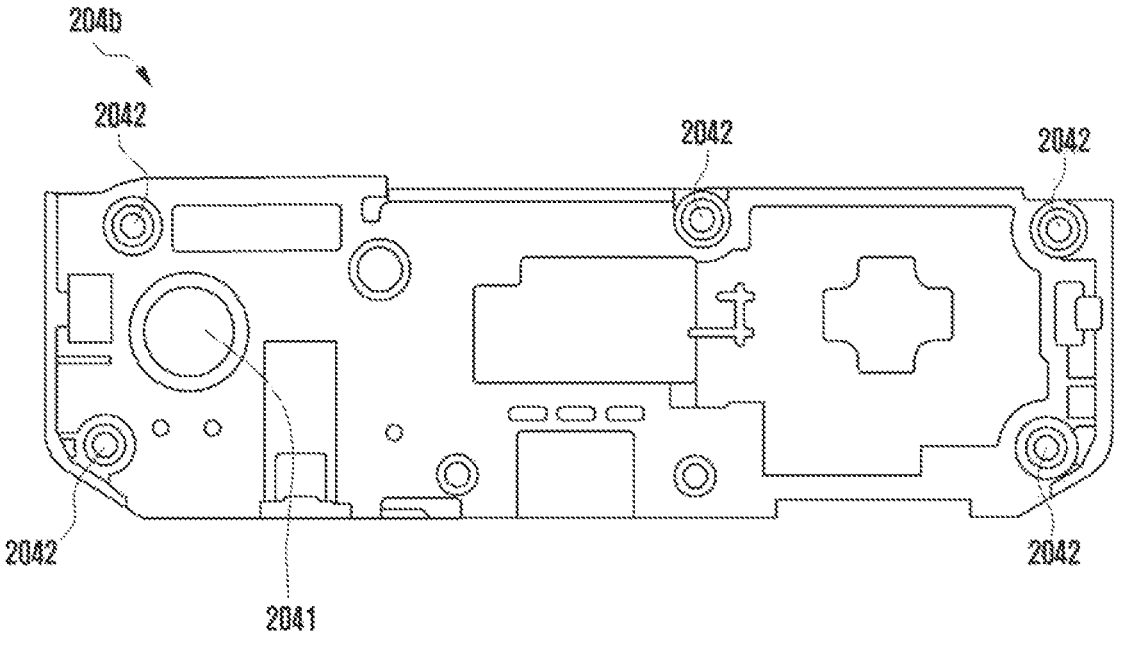
FIG. 6 is a plan view illustrating a second support member of an electronic device according to one or more embodiments of the disclosure.

FIG. 6 is a plan view illustrating a second support member 204b of an electronic device according to some embodiments of the disclosure.

FIG. 6 is a plan view obtained by viewing the second support member in the direction indicated by arrow B in FIG. 2B.

Referring to FIG. 6, a fixing member accommodating portion 2041 may be provided on the surface of the second support member 204b. In FIG. 6, the fixing member accommodating portion 2041 is illustrated in a circular shape, but this is exemplary. The fixing member accommodating portion 2041 may have a shape and a depth corresponding to the shape of the upper end portion of the fixing member.

The second support member 204b may be fastened to the frame 202 through screws, bolts, rivets, clips, or similar fastening members. The second support member 204b may include fastening holes 2042 configured to allow fastening members to pass therethrough. Since the second support member 204b is fastened to the frame 202, the second circuit board assembly 203b may be further compressed so that the second circuit board assembly 203b can be prevented from moving and the cable 2031 can be prevented from being separated from the guide groove 330.

When the second support member 204b is fastened to the frame 202, the second support member 204b is brought into close contact with the second circuit board assembly 203b, so that the circuit board fixing members 2024 penetrating the second circuit board assembly 203b can be seated in the fixing member accommodating portions 2041 provided on the surface of the second support member 204b.

The embodiments disclosed in the specification and drawings are provided merely to easily describe the technical features according to the embodiments disclosed herein and to help understanding of the embodiments disclosed herein and are not intended to limit the scope of the embodiments disclosed herein. Therefore, the scope of the one or more embodiments disclosed herein should be construed as including, in addition to the embodiments disclosed herein, all changes or modifications derived based on the technical ideas of the various embodiments disclosed herein.

What is claimed is:

1. An electronic device comprising:
a frame comprising a coupling surface;
a circuit board assembly coupled to the coupling surface of the frame, the circuit board assembly comprising a circuit board and a fixing hole provided in a surface of the circuit board and penetrating the circuit board in a thickness direction;
a connecting member electrically connected to the circuit board assembly; and
a circuit board fixing member provided on the coupling surface of the frame and passing through the fixing hole in the circuit board to fix the circuit board assembly to the frame,
wherein the circuit board fixing member comprises:
a snap-fitting portion configured to be elastically deformed when passing through the fixing hole to couple the circuit board assembly to the coupling surface, and configured to prevent the circuit board assembly coupled to the coupling surface from moving;
a guide groove in which the connecting member is accommodated; and
a body portion fixed on the coupling surface and configured to support the snap-fitting portion and the guide groove.

2. The electronic device of claim 1, wherein the circuit board fixing member is integrally molded on the coupling surface of the frame to which the circuit board assembly is coupled.

3. The electronic device of claim 1, wherein the body portion of the circuit board fixing member has a polygonal shape or an elliptical cross-sectional shape.

4. The electronic device of claim 1, wherein the body portion of the circuit board fixing member has a circular cross-sectional shape, and
wherein the circuit board fixing member comprises at least one movement prevention protrusion protruding from the body portion in a direction parallel to a surface of the circuit board assembly.

5. The electronic device of claim 1, wherein the body portion of the circuit board fixing member has a tapered shape in which a diameter increases in a direction in which the circuit board assembly is coupled to the frame.

6. The electronic device of claim 1, wherein the snap-fitting portion comprises a first inclined surface which is inclined in a direction in which a width of the snap-fitting portion increases in a direction in which the circuit board assembly is coupled to the frame.

7. The electronic device of claim 6, wherein the snap-fitting portion comprises a second inclined surface disposed below the first inclined surface, and wherein the second inclined surface is inclined in the direction in which the width of the snap-fitting portion decreases in the direction in which the circuit board assembly is coupled to the frame.

8. The electronic device of claim 1, further comprising a support member comprising a fixing member accommodating portion fastened to the coupling surface of the frame and configured to press the circuit board assembly, wherein the support member has a shape corresponding to a shape of an upper end portion of the circuit board fixing member.

9. The electronic device of claim 1, wherein the guide groove comprises irregularities provided on an inner surface thereof.

10. A circuit board fixing member for an electronic device, which comprises a frame, a circuit board assembly coupled to a coupling surface of the frame and a fixing hole, and a cable coupled to a circuit board, the circuit board fixing member comprising:

a snap-fitting portion configured to be elastically deformed when passing through the fixing hole to couple the circuit board assembly to the coupling surface and configured to prevent the circuit board assembly coupled to the coupling surface from moving;

a cable guide groove configured to accommodate the cable therein; and a body portion fixed on the coupling surface of the frame and configured to support the snap-fitting portion and the cable guide groove.

11. The circuit board fixing member of claim 10, wherein the body portion of the circuit board fixing member has a polygonal shape or elliptical cross-sectional shape.

12. The circuit board fixing member of claim 10, wherein the body portion of the circuit board fixing member has a circular cross-sectional shape, and wherein the circuit board fixing member comprises at least one movement prevention protrusion protruding from the body portion in a direction parallel to a surface of the circuit board assembly.

13. The circuit board fixing member of claim 10, wherein the body portion of the circuit board fixing member has a tapered shape in which a diameter increases in a direction in which the circuit board assembly is coupled to the frame.

14. The circuit board fixing member of claim 10, wherein the snap-fitting portion comprises a first inclined surface which is inclined in a direction in which a width of the snap-fitting portion increases in a direction in which the circuit board assembly is coupled to the frame.

15. The circuit board fixing member of claim 14, wherein the snap-fitting portion comprises a second inclined surface disposed below the first inclined surface, and wherein the second inclined surface is inclined in the direction in which the width of the snap-fitting portion decreases in the direction in which the circuit board assembly is coupled to the frame.

* * * * *